(12) United States Patent
Preusse

(10) Patent No.: US 6,841,056 B2
(45) Date of Patent: Jan. 11, 2005

(54) APPARATUS AND METHOD FOR TREATING A SUBSTRATE ELECTROCHEMICALLY WHILE REDUCING METAL CORROSION

(75) Inventor: Axel Preusse, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 191 days.

(21) Appl. No.: 10/304,903

(22) Filed: Nov. 26, 2002

(65) Prior Publication Data

US 2004/0000486 A1 Jan. 1, 2004

(30) Foreign Application Priority Data

Jun. 28, 2002 (DE) .......................................... 102 28 998

(51) Int. Cl.[7] .............................. C25D 5/00; C25D 17/00
(52) U.S. Cl. ...................... 205/88; 204/194; 204/227; 205/205; 205/291; 205/799; 438/800; 438/905; 438/909
(58) Field of Search ......................... 205/88, 205, 291, 205/799; 204/194, 227; 438/800, 905, 909

(56) References Cited

U.S. PATENT DOCUMENTS 6,241,869 B1  6/2001  Maeda ....................... 205/137

2001/0040098 A1  11/2001  Okase et al. ................... 205/82
2002/0027082 A1  3/2002  Andricacos et al. ........ 205/157

FOREIGN PATENT DOCUMENTS

| JP | 2001319915 A | 11/2001 | ......... H01L/21/304 |
| WO | WO 02/47139 A2 | 6/2002 | ......... H01L/21/288 |

OTHER PUBLICATIONS

Aksu and Doyle, "Electrochemistry of Copper in Aqueous Glycine Solutions," *J. Electrochem. Soc.*, 148:B51–57, 2001 no month given.

*Primary Examiner*—Robert R. Koehler
(74) *Attorney, Agent, or Firm*—Williams, Morgan & Amerson, P.C.

(57) ABSTRACT

A process tool for electrochemically treating a substrate is configured to reduce the oxygen concentration and/or the sulfur dioxide concentration in the vicinity of the substrate so that corrosion of copper may be reduced. In one embodiment, a substantially inert atmosphere is established within the process tool including a plating reactor by providing a continuous inert gas flow and/or by providing a cover that reduces a gas exchange with the ambient atmosphere. The substantially inert gas atmosphere may also be maintained during further process steps involved in electrochemically treating the substrate including required transportation steps between the individual process steps.

25 Claims, 2 Drawing Sheets

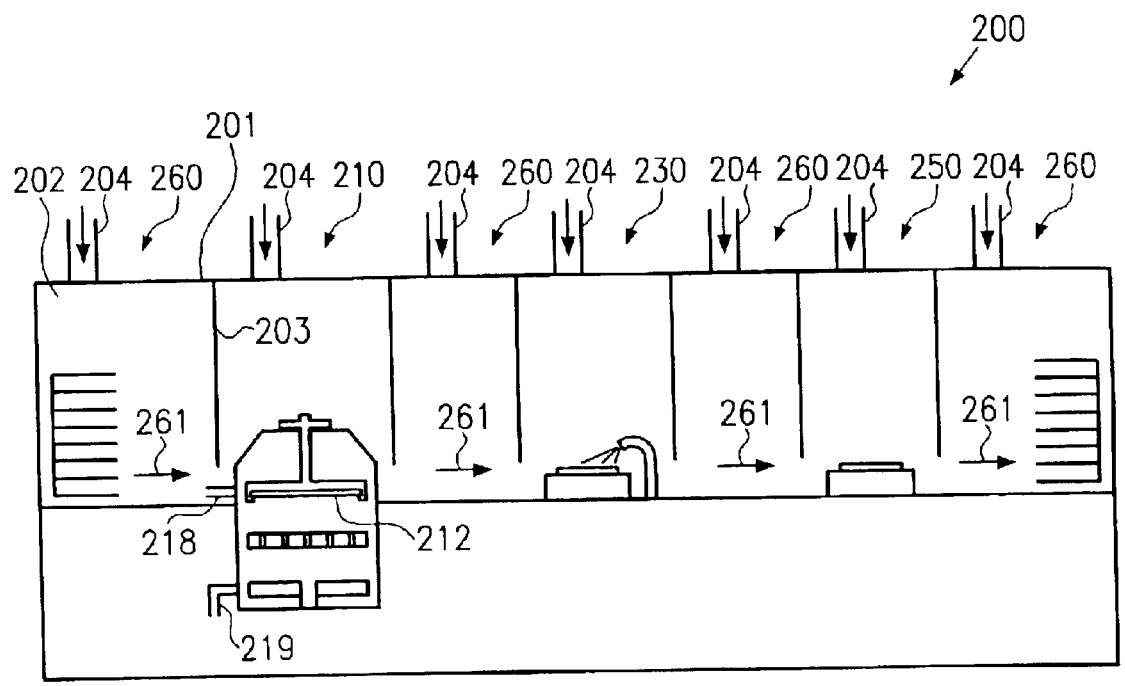
Fig.2b
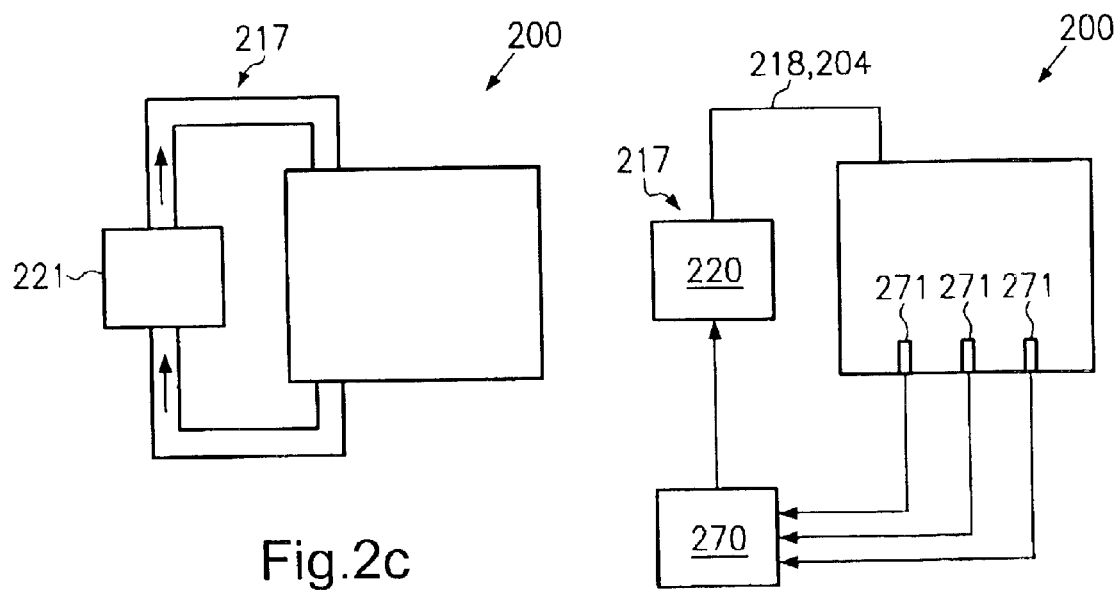
Fig.2c
Fig.2d

APPARATUS AND METHOD FOR TREATING A SUBSTRATE ELECTROCHEMICALLY WHILE REDUCING METAL CORROSION

BACKGROUND OF THE INVENTION

1. Field of the Invention

The present invention relates to the field of fabrication of integrated circuits, and, more particularly, to electrochemically treating substrates during various steps of production to deposit and/or remove a metal on/from the substrate.

2. Description of the Related Art

The materials used in multilevel interconnect technology of integrated circuits (IC) are thin films of conductors and thin films of insulators. To manufacture conductive thin films, aluminum and aluminum alloys have been widely used in combination with silicon dioxide ($SiO_2$) as an insulator. To further improve device performance, in view of signal propagation delay and power consumption of an IC, copper, possibly in combination with a low-k dielectric material, is nowadays increasingly replacing aluminum and silicon dioxide. Furthermore, the use of the copper technology results in a reduction of the number of necessary metallization levels. In manufacturing multilevel interconnection systems, plating, in the form of electroplating and electroless plating, and the reverse process, also referred to as an electropolishing process, have become widely-used metal deposition/removing techniques.

To obtain a required quality of the metal layers, typically a variety of chemicals are used in the electrochemical metal plating process. In many electrolytes used for plating a metal on a substrate, an inorganic acid is used as the main ingredient for the plating solution. Sulfuric acid or phosphoric acid is widely used in a variety of concentrations. Sulfuric acid and phosphoric acid are known to etch copper, irrespective of the concentration with which the sulfuric acid and phosphoric acid are provided. The etch rate is further increased when oxygen is readily available at the metal areas formed on semiconductor substrates, as is the case in a conventional plating process due to the oxygen contained in the ambient air.

Owing to the presence of oxygen, sulfur dioxide (that may be present in the ambient in minute amounts) and water (contained in the water-diluted acids), a significant degree of oxidation and discoloration of the metal formed on the semiconductor substrates may occur. This situation is even exacerbated during subsequent transport, store, rinse and cleaning actions, all of which are performed under wet conditions, i.e., under conditions that promote oxidation and discoloration of copper. The same is true for copper-containing substrates that are subjected to an electropolishing process that is quite similar to electroplating, wherein, however, the flow of the ions is reversed.

Since copper is increasingly used in semiconductor production and, as explained above, since exposed copper surfaces tend to readily react with oxygen to form corrosion and discoloration, this corrosion and discoloration may, in turn, tend to compromise the quality of the resulting surface and adversely affect subsequent process steps. In view of the foregoing, it is clear that the plating and electropolishing of copper on semiconductor substrates is critical for the reliability of the completed integrated circuit.

Therefore, a need exists for an apparatus and a method to form and treat metal layers, especially copper layers, without unduly deteriorating the surface quality.

SUMMARY OF THE INVENTION

The present invention is directed to methods and apparatus to reduce the amount of oxygen and sulfur dioxide coming into contact with exposed metal surfaces before, during and after plating and/or electropolishing metal-containing substrates. By significantly reducing the partial pressure of oxygen and/or sulfur dioxide prevailing over a substrate to be processed or otherwise handled, the probability of a chemical reaction with an exposed metal surface and these reactive ambient components may be reduced.

According to one embodiment of the present invention, a process tool for electrochemically treating a substrate comprises a plating reactor and a cover enclosing the plating reactor to define an internal volume containing an internal gas atmosphere. Thereby, the cover is configured to substantially avoid a gas exchange with an ambient atmosphere.

According to another embodiment of the present invention, a process tool for electrochemically treating a substrate comprises a plating reactor and a gas supply system configured to provide a flow of inert gas to the plating reactor to reduce at least one of an oxygen concentration and a sulfur dioxide concentration in the plating reactor.

According to yet another embodiment of the present invention, a method of electrochemically treating a substrate comprises providing a process tool configured to electrochemically treat the substrate. Next, a gas atmosphere is established that surrounds the substrate, wherein the gas atmosphere has a lower oxygen concentration than an ambient atmosphere surrounding the process tool.

BRIEF DESCRIPTION OF THE DRAWINGS

The invention may be understood by reference to the following description taken in conjunction with the accompanying drawings, in which like reference numerals identify like elements, and in which:

FIG. 2b schematically shows a view of the process tool of FIG. 2a including further process stations involved in electrochemically treating the substrate;

FIG. 2c shows a schematic view of the process tool with recirculated inert gas, according to the present invention; and FIG. 2d shows a schematic view of a system including the process tool of FIG. 2a that allows improved process control according to another illustrative embodiment of the invention.

Figure 1:
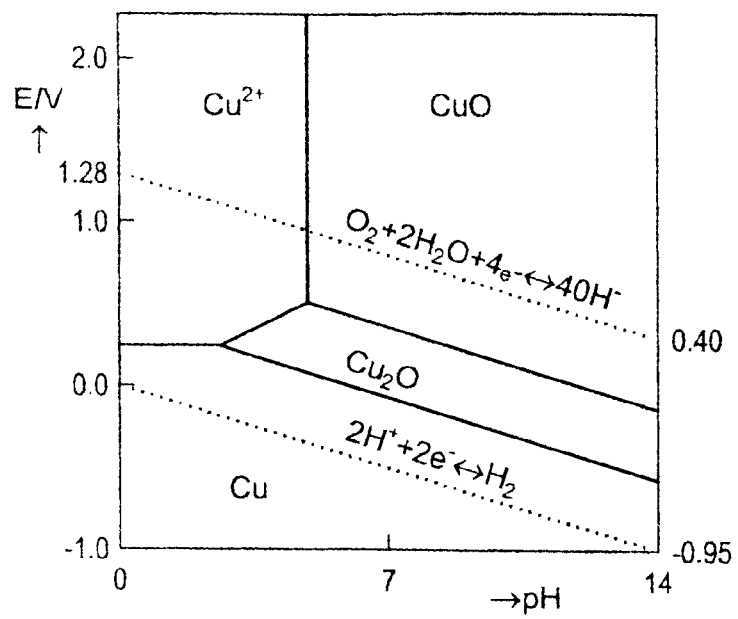
FIG. 1 shows a Pourbaix diagram of copper.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

In the following, the chemistry involved in copper plating and electropolishing will be described in more detail with reference to FIG. 1. However, the present invention should not be considered as limited to use with copper, unless such limitations are expressly set forth in the appended claims.

It is well known, that copper is oxidized in air to form copper oxide. In the presence of carbon dioxide ($CO_2$), copper may form the so-called green copper carbonate. In the presence of sulfur dioxide ($SO_2$), which may be present in air, copper may form a sulfate. Therefore, a copper layer on a substrate may most likely be subjected to various oxidation processes creating copper ions ($Cu^+$ or $Cu^{++}$) as part of a compound according to the relations given in Equation 1a. These reactions preferably take place in the presence of oxygen and water, which are commonly also present in the ambient air.

$$O_2 + 2H_2O + 4e^- \rightarrow 4OH^- \qquad \text{Equation 1}$$

$$2Cu \rightarrow 2Cu^{2+} + 4e^- \qquad \text{Equation 1a}$$

$$2H^+ + 2e^- \rightarrow H_2 \qquad \text{Equation 2}$$

Equation 1 shows the chemical reaction resulting in the so-called oxygen corrosion. The equation shows that oxygen present in air or dissolved in water leads to an oxidation process. The electrons necessary in Equation 1 are spent, for example, by the process of Equation 1a and copper is transformed to $Cu^{2+}$.

FIG. 1 illustrates more clearly this situation, in which the so-called Pourbaix diagram of copper is depicted. The Pourbaix diagram shows the electrochemical potentials of copper, its oxides, $Cu_2O$ and $CuO$, and of the copper ion ($Cu^{++}$) as a function of the pH value. The diagram shows four separate areas denoted as $Cu$, $Cu_2O$, $CuO$ and $Cu^{2+}$. The areas are separated by lines representing the situation of equilibrium of the compounds of the neighboring areas. The equilibrium may exist between two compounds along a line in the diagram or between three compounds around an intersection of lines separating different pairs of compounds. The redox potentials of the oxygen reduction according to Equation 1 are also shown in the Pourbaix diagram of FIG. 1. Over the entire pH area, the redox potentials of the oxygen reduction are above the copper equilibrium where $Cu_2O$ and $CuO$ is formed as a protective layer. As a consequence, in the presence of oxygen, according to Equation 1, copper will be oxidized to form copper oxide (CuO) or copper ions ($Cu^{++}$), depending on the pH value.

Another possible situation is demonstrated by Equation 2 and the corresponding electrochemical potential of this equation is also presented in the Pourbaix diagram of FIG. 1. The process according to Equation 2 is generally addressed as hydrogen corrosion, which takes place by reducing $2H^+$ to $H_2$. As is known from electrochemical potentials, copper is more noble than hydrogen. This fact is represented by the redox function of Equation 2 in the Pourbaix diagram of FIG. 1. Along the entire pH area, the redox potential curve, according to Equation 2, is within the area of elementary copper.

It has been demonstrated that, preferably in the presence of oxygen and water, an oxidation process of copper will take place.

$$4CuO + SO_2 + 3H_2O + 0,5O_2 \rightarrow CuSO_4 \cdot 3Cu(OH)_2 \qquad \text{Equation 3}$$

Equation 3 shows the formation of caustic copper in the presence of sulfur dioxide ($SO_2$), water and oxygen. Caustic copper has a good solubility in water. Therefore, the reaction according to Equation 3 removes the copper oxide (CuO) protective layer and may cause further attack of the copper layer. In a similar way, a carbonate of copper may be produced in the presence of humidity, oxygen and carbon dioxide ($CO_2$).

It is, therefore, considered important in the present invention to minimize the amount of sulfur dioxide and/or the amount of oxygen and/or the amount of carbon dioxide and the amount of humidity during process stages involving the handling of substrates having exposed copper areas. In particular, the processes involved in electroplating/electropolishing substrates continually create environmental conditions that promote oxidation of copper surfaces.

The present invention is, therefore, based on the concept of creating a local ambient for a substrate to be subjected to a process sequence requiring an electrochemical treatment, in which the amount of sulfur dioxide and/or oxygen and/or carbon dioxide is considerably reduced to thereby shift the equilibrium in Equation 3 towards copper oxide (left side) and to reduce the copper oxidation according to Equations 1, 1a and 2. This may be accomplished by providing a substantially inert atmosphere around the substrate to be processed by supplying substantially inert gases, such as nitrogen, argon, and the like, to the process tool under consideration or at least to relevant portions of the process tool. By establishing the substantially inert atmosphere, the partial pressure over the substrate of sulfur dioxide and/or oxygen and/or carbon dioxide is significantly lowered compared to the ambient atmosphere and reduces the probability for the chemical reaction of an exposed metal surface with these reactive components. Reducing the partial pressure may also allow the removal, to a certain degree, of these ambient gases from process liquids, such as electrolytes, water, for example in the form of ultra pure water, and the like, in which these ambient gases may have dissolved during storing and handling of the process liquids.

Figure 2A:
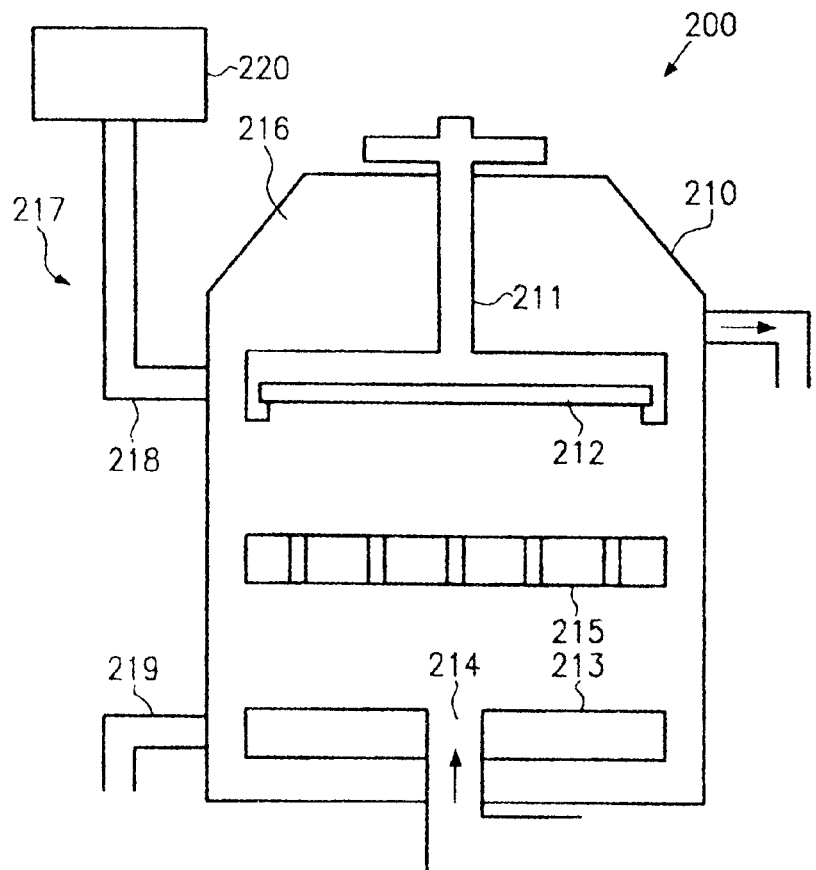
FIG. 2a shows a simplified portion of a schematic view of a process tool for electrochemically treating a substrate according to one illustrative embodiment of the invention.

With reference to FIGS. 2a and 2b, illustrative embodiments of the present invention will now be described. In FIG. 2a, a portion of a process tool 200 for electrochemically treating a substrate comprises a plating reactor 210, which may be, in the present example, an electroplating reactor including a rotatable substrate holder 211 that is adapted to receive and hold a substrate 212, and an anode 213 having formed therein an inlet 214 for introducing electrolyte during the processing of the substrate 212. Moreover, a diffuser element 215 may be arranged between the anode 213 and the substrate holder 212. In the present embodiment, the electroplating reactor 210 represents a so-called fountain-type electroplating reactor. However, the specific type of plating reactor used is not essential for the present invention and, thus, any type of plating reactor including an arrangement configured to perform electropolishing, i.e., the reversed electroplating process, may be used in accordance with the present invention. The plating reactor 210 may be configured to define an internal volume 216 including, during operation of the electroplating reactor 210, an internal gas atmosphere that contains, in conventional apparatus, a gas mixture substantially corresponding to the ambient atmosphere. In one embodiment, contrary to a conventional apparatus, the electroplating reactor 210 comprises a gas supply system 217 that is configured to supply an inert gas, such as nitrogen, argon, or a noble gas and the like, to the internal volume 216. The gas supply system 217 includes a first supply line 218 coupled at one end thereof to an inert gas source 220 and at the other end to the internal volume 216. Moreover, a second supply line 219 may be provided, one end of which is coupled to the internal volume 216 and the other end thereof coupled to an exhaust source (not shown). The first and second supply lines 218, 219, although shown to be connected to the electroplating reactor 210 at an upper side portion and a lower side portion, may be arranged in any appropriate manner, depending on the type of electroplating reactor 210 used in the process tool 200 to feed inert gas to the internal volume 216.

In operation, an inert gas, for example nitrogen, may be supplied from the inert gas source 220 via the first supply line 218 into the internal volume 216 to establish a substantially inert atmosphere within the electroplating reactor 210, thereby significantly reducing the amount of sulfur dioxide and oxygen. It should be noted that the term "substantially inert gas atmosphere" as used herein is to describe a gas atmosphere, the oxygen concentration of which deviates from that of the ambient atmosphere, usually the atmosphere in a clean room, by at least 20%, so that a maximum oxygen concentration is approximately 16%, and preferably less than 5%, and more preferably less than 1%. Subsequently, the substrate 212 may be loaded into the electroplating reactor 210 and may be received by the substrate holder 211. Depending on the type of process tool 200, the internal substantially inert atmosphere of the internal volume 216 may be in contact with the ambient atmosphere so that a certain amount of gas exchange may take place.

Thus, in one embodiment, a certain amount of overpressure is created by the gas supply system 217 to thereby establish a gas flow from the internal volume 216 towards an opening (not shown) from which the substrate 212 is loaded onto the substrate holder 211. In this way, the introduction of oxygen and sulfur dioxide from the ambient atmosphere into the internal volume 216 is minimized. A certain amount of overpressure, by establishing a continuous fluid flow, may be advantageously maintained in electroplating reactors 210 that are not configured to sufficiently seal the internal volume 216 from the ambient atmosphere during operation. After placing the substrate 212 on the substrate holder 211, and possibly after closing an opening for the substrate transfer to the substrate holder 211, the gas system 218 may be operated to purge the internal volume 216, for example, by means of the second supply line 219, to further reduce the amount of oxygen and of sulfur dioxide that may have been introduced during loading of the substrate 212 into the electroplating reactor 210. Then, operation of the electroplating reactor 210 is started, wherein, contrary to conventional apparatus, the electroplating process takes place in a substantially inert internal gas atmosphere to thereby significantly reduce the corrosion process at the copper surface being plated on the substrate 212.

FIG. 2b schematically shows the process tool 200 with additional process modules coupled to the electroplating reactor 210. In FIG. 2b, the process tool 200 further comprises a rinse station 230 downstream of the electroplating reactor 210 and a dry station 250 downstream of the rinse station 230. The electroplating reactor 210, the rinse station 230 and the dry station 250 are connected by a plurality of substrate transport modules 260 that are configured to allow substrate transportation, as indicated by arrows 261. The process tool 200 further comprises a cover 201 that defines an internal volume 202. In one embodiment, the cover 201 is configured to substantially prevent a gas exchange with the ambient atmosphere, whereas, in other embodiments, the cover 201 is designed to at least remarkably reduce a gas exchange of the internal volume 202 with the ambient atmosphere. The cover 201 may comprise a plurality of baffles 203 that allow a certain degree of separation between the individual process modules and stations.

In one embodiment, as depicted in FIG. 2b, the gas supply system 217 additionally comprises a plurality of supply lines 204 arranged to provide inert gas to at least some of the process stations 210, 230, 250 and the transportation modules 260. In other embodiments, one or more exhaust lines (not shown) may be provided to establish a continuous gas flow, especially when the cover 201 substantially completely seals the internal volume 202 from the ambient atmosphere. It is to be noted that the embodiment depicted in FIG. 2b is only of an illustrative nature and many variations and modifications may be carried out without departing from the scope of the present invention. For instance, the provision, the design and the arrangement of the baffles 203 may be altered in many ways, depending on the configuration of the process stations 210, 230, 250 and the transportation modules 260. In particular, the rinse station 230 and the dry station 250 are shown as "open" systems, whereas, in other embodiments, these stations may include process chambers that may have separate enclosures requiring the provision of additional supply lines, such as the supply lines 218, 219. Moreover, the transportation modules 260 may include any type of wafer handling apparatus and, accordingly, the baffles 203 may be designed so as to allow loading and de-loading activities to and from the adjacent process stations, while reducing gas exchange between adjacent stations and modules. In other embodiments, the baffles 203 may be completely omitted, especially when the rinse station 230 and the dry station 250 individually comprise a process chamber having an enclosure.

In operation, the substrate 212, having a copper surface that is electroplated under conditions as described with reference to FIG. 2a, is transferred to the process module 260 downstream of the electroplating reactor 210. Since a substantially inert gas atmosphere is established in the internal volume 202 by the supply lines 204, the wet and sensitive surface of the previously plated copper will be substantially prevented from coming into contact with oxygen and/or sulfur dioxide. In particular, the substrate 212 typically comprises a thin film of electrolyte upon completion of the plating process and the substantially inert gas atmosphere in the internal volume 202 may reduce the probability for the corrosion of the newly-plated copper surface during transportation to the rinse station 230. Since the substrate 212 is processed in the rinse station 230 and the dry station 250, including transportation between these process stations, in a substantially inert gas atmosphere, corrosion of copper is also minimized during the post-plating processes.

It should be noted that the process tool 200 may comprise a greater number of process modules, as shown in FIG. 2b, in accordance with process requirements. For example, the rinse station 230 may represent any cleaning station required for the processing of substrates, including sophisticated metallization layers. Moreover, other embodiments, especially those process stations involving a "wet" processing of the substrate 202, may include an exhaust line, such as the second supply line 219 of the electroplating reactor 210, to continuously reduce the humidity in the corresponding local atmosphere.

A modular structure, as shown in FIG. 2b, further allows the individual accessing of process stations and/or transportation modules without unduly affecting the gas atmosphere of adjacent process stations and modules. For example, the modular configuration of the process tool 200 allows for loading and de-loading of substrates from and to the process tool 200, for example, by means of the first and the last transportation modules 260, without unduly compromising the inert gas atmosphere in the remaining internal volume 202.

FIG. 2c schematically shows a further illustrative embodiment of the present invention, wherein the gas supply system 217 of the process tool 200 comprises a reactor 221 that is configured to remove oxygen and/or sulfur dioxide from an inert gas. The reactor 221 may be any type of chemical and/or physical reactor, including, for example, a catalyst, that allows the removal of oxygen and/or sulfur dioxide, in a manner as is well-known in the art. This embodiment is especially advantageous when the process tool 200 requires the supply of large amounts of inert gases or the supply of relatively expensive inert gases, such as argon or other noble gases, since the main amount of the inert gas may be reworked and reused. When using the gas supply system 217 as shown in FIG. 2c, the cover 201 is preferably configured to minimize leakage of inert gas to the ambient atmosphere.

FIG. 2d schematically shows a further variation of the process tool 200. In FIG. 2d, the process tool 200 comprises a plurality of sensor elements 271 that are connected to a control unit 270, which, in turn, is operatively coupled to the gas supply system 217 including the inert gas source 220. The sensor elements 271 may include a pressure sensor, an oxygen concentration sensor, a sulfur dioxide concentration sensor, and the like. The sensor elements 271 may be provided in one or more of the process stations 210, 230, 250 and the transportation modules 260. The control unit 270 may be configured to receive the signals output by the sensor elements 271 and to perform process control on the basis of the received sensor signals. For example, the gas supply system 217 may comprise suitable means to adjust the fluid flow through the supply line 204 or the supply lines 218 and 219. Corresponding means are well-known in the art and may include valve elements, pumps, fans, and the like.

The control unit 270 may then correspondingly adjust one or more of these flow-adjusting means to control fluid flow in the supply lines 204, 218, 219, thereby also controlling the atmosphere within the internal volume 202. For instance, upon loading a substrate into a respective process station or by loading an externally supplied substrate into the process tool 200, for example, at the first transportation module 260, it may be advantageous to temporarily increase fluid flow to the electroplating reactor 210 so as to effectively reduce the diffusion of oxygen and/or sulfur dioxide into the electroplating reactor 210. Similarly, the substantially inert gas atmosphere in the other process stations 230, 250 and transportation modules 260 may be controlled. Moreover, by controlling the substantially inert gas atmosphere in accordance with measurement results provided by the sensor elements 271, the amount of inert gas supplied to the process tool 200 may be reduced to the actually required amount, thereby saving resources.

As a result, the present invention efficiently allows one to reduce the probability for the formation of copper corrosion in processes involved in electrochemically treating a substrate, such as electroplating, electropolishing and the like, wherein a substantially inert gas atmosphere is established around the substrate by a continuous gas flow and/or by providing a cover defining an internal volume with a substantially inert gas atmosphere within the process tool or at least within a part of the process tool. Preferably, other processes associated with electrochemically treating the substrate, such as loading, transportation, cleaning, drying and temporarily storing of the substrate, are also performed within a substantially inert atmosphere. It should be noted that these processes may be carried out in separate process tools or in process tools that are configured to perform two or more processes, or even a complete process sequence, and the present invention is to cover any such type of process tool.

It should be noted that, although the present invention has been described with reference to copper plating, the principles of the present invention may also be readily applied to the electrochemical treatment of substrates with metals other than copper, wherein a substantially inert atmosphere is advantageous to improve the process quality.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A process tool for electrochemically treating a substrate, comprising:
   a plating reactor; and
   a cover enclosing said plating reactor to define an internal volume containing an internal gas atmosphere, wherein said cover is configured to substantially avoid a gas exchange with an ambient atmosphere.

2. The process tool of claim 1, further comprising a gas supply system configured to introduce an inert gas into said internal volume to establish a substantially inert gas atmosphere therein.

3. The process tool of claim 1, further comprising at least one of a transportation module, a substrate cleaning station, a substrate drying station and a chemical storage tank, wherein said cover is configured to enclose at least partially the at least one transportation module, substrate cleaning station, substrate drying station and chemical storage tank.

4. The process tool of claim 1, wherein the internal gas atmosphere comprises at least one of nitrogen gas and a noble gas.

5. The process tool of claim 2, wherein said gas supply system further comprises an inlet line and an exhaust line for supplying an inert gas to the internal volume and to discharge gas from the internal volume.

6. The process tool of claim 5, wherein said gas supply system further comprises a reactor configured to remove at least one of oxygen and sulfur dioxide from a gas supplied thereto.

7. The process tool of claim 6, wherein said gas supply system comprises a plurality of inlet lines to provide an inert gas to one or more specified locations within the internal volume.

8. The process tool of claim 1, wherein the cover is configured to divide the internal volume in a plurality of segments, wherein the gas exchange between adjacent volume segments is reduced.

9. The process tool of claim 2, wherein said gas supply system is configured to establish a continuous inert gas flow in said plating reactor.

10. The process tool of claim 1, further comprising one or more sensor elements coupled to a control unit.

11. The process tool of claim 10, wherein said one or more sensor elements comprise at least one of an oxygen sensor and a pressure sensor.

12. The process tool of claim 11, wherein said process tool further comprises a gas supply system and a control unit that is operatively coupled to the gas supply system to control operation of the gas supply system to adjust at least one of an oxygen concentration, a pressure in the internal volume and a flow rate of gas through said gas supply system.

13. A process tool for electrochemically treating a substrate, comprising:

a plating reactor; and a gas supply system configured to provide a flow of inert gas to the plating reactor to reduce at least one of an oxygen concentration and a sulfur dioxide concentration in the plating reactor.

14. The process tool of claim 13, wherein said gas supply system comprises an inert gas source including at least one of nitrogen and a noble gas.

15. The process tool of claim 14, wherein the gas supply system comprises at least one gas outlet arranged to establish a substantially inert atmosphere around a substrate in said plating reactor.

16. The process tool of claim 13, further comprising at least one of a transportation module, a cleaning station and a drying station arranged in said flow of inert gas.

17. The process tool of claim 13, further comprising a cover configured to at least partially enclose said plating reactor.

18. The process tool of claim 17, wherein said cover is configured to substantially prevent gas exchange of an internal volume defined by said cover and an ambient atmosphere and wherein said cover comprises an outlet to establish said flow of inert gas within the internal volume.

19. The process tool of claim 17, wherein said cover is configured to at least partially enclose the at least one of a transportation module, a cleaning station and a drying station.

20. A method of electrochemically treating a substrate, the method comprising:

providing a process tool configured to electrochemically treat the substrate; and establishing a gas atmosphere surrounding said substrate, wherein said gas atmosphere has a lower oxygen concentration than an ambient atmosphere surrounding said process tool.

21. The method of claim 20, wherein establishing said gas atmosphere includes supplying an inert gas to the substrate.

22. The method of claim 21, wherein said inert gas comprises at least one of nitrogen and a noble gas.

23. The method of claim 20, wherein establishing said gas atmosphere includes defining an internal volume by providing a cover that reduces a gas exchange of said gas atmosphere with the ambient atmosphere.

24. The method of claim 20, further comprising detecting at least one of a pressure of said gas atmosphere, an oxygen concentration and a sulfur dioxide concentration.

25. The method of claim 24, further comprising controlling the establishment of said gas atmosphere on the basis of the detection of at least one of a pressure of the gas atmosphere, an oxygen concentration and a sulfur dioxide concentration.

* * * * *